United States Patent
Cuggino et al.

(10) Patent No.: US 11,942,901 B2
(45) Date of Patent: Mar. 26, 2024

(54) GAIN COMPENSATION CIRCUIT

(71) Applicant: SKYWORKS SOLUTIONS, INC., Irvine, CA (US)

(72) Inventors: Joseph A Cuggino, Westford, MA (US); Anthony Francis Quaglietta, Methuen, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 68 days.

(21) Appl. No.: 17/860,981

(22) Filed: Jul. 8, 2022

(65) Prior Publication Data
US 2023/0037298 A1 Feb. 9, 2023

Related U.S. Application Data

(63) Continuation of application No. 17/112,799, filed on Dec. 4, 2020, now Pat. No. 11,418,150.

(60) Provisional application No. 62/944,161, filed on Dec. 5, 2019.

(51) Int. Cl.
| H03F 1/30 | (2006.01) |
| H03F 1/32 | (2006.01) |
| H03F 3/04 | (2006.01) |
| H03F 3/32 | (2006.01) |

(52) U.S. Cl.
CPC .............. *H03F 1/30* (2013.01); *H03F 1/32* (2013.01); *H03F 3/04* (2013.01); *H03F 2200/447* (2013.01)

(58) Field of Classification Search
CPC ..... H03F 1/30; H03F 1/32; H03F 3/04; H03F 2200/447; H03F 2200/408; H03G 1/0035; H03G 2201/708; H03G 1/04
USPC ................................ 330/285, 288–289, 296
See application file for complete search history.

(56) References Cited

U.S. PATENT DOCUMENTS 10,439,562 B2 * 10/2019 Tokuda ................... H03F 1/30
2002/0135423 A1 * 9/2002 Yamashita ............. H03F 1/301
330/285

* cited by examiner

*Primary Examiner* — Hieu P Nguyen
(74) *Attorney, Agent, or Firm* — Chang & Hale LLP

(57) ABSTRACT

A circuit comprises an amplifier network including a first amplifier and a second amplifier and a first transistor having a first base. The first transistor is thermally isolated from the second amplifier. The circuit further comprises a second transistor having a second base. The second transistor is thermally linked to the second amplifier. The circuit further comprises coupling circuitry configured to couple the first base to the second base.

20 Claims, 4 Drawing Sheets

GAIN COMPENSATION CIRCUIT

CROSS-REFERENCE TO RELATED APPLICATION(S)

This application is a continuation of U.S. application Ser. No. 17/112,799 filed Dec. 4, 2020, entitled GAIN COMPENSATION CIRCUIT, which claims priority to U.S. Provisional Application No. 62/944,161 filed Dec. 5, 2019, entitled GAIN COMPENSATION CIRCUIT, the disclosures of which are hereby expressly incorporated by reference herein in their entirety.

BACKGROUND

Field

The present disclosure relates to amplifier devices.

Description of the Related Art

When an amplifier is turned on, the active amplification devices within the amplifier turn on and hence some level of self-heating of the amplifier is realized such that a temperature at and/or around the amplifier may increase. In some cases, an amplifier may have multiple amplification stages which may each experience some level of self-heating. This 'self-heating' effect may result in a decrease of gain of the amplifier and/or gain variation over time which may cause degradation of the error vector magnitude (EVM) of the amplifier (which is a measure of linearity).

SUMMARY

In accordance with a number of implementations, the present disclosure relates to a circuit comprising an amplifier network including a first amplifier and a second amplifier and a first transistor having a first base. The first transistor is thermally isolated from the second amplifier. The circuit further comprises a second transistor having a second base. The second transistor is thermally linked to the second amplifier. The circuit further comprises coupling circuitry configured to couple the first base to the second base.

The circuit may further comprise a first resistor coupled to the first base and a second resistor coupled to the second base. In some embodiments, the circuit further comprises a bias network configured to bias the first amplifier with a reference current, the bias network including a first resistor, a second resistor, and a third transistor.

In some embodiments, the coupling circuitry is further configured to couple the first resistor, the second resistor, the first transistor, and the second transistor at a first node. The coupling circuitry may be further configured to couple the second resistor, the third transistor, and the first transistor at a second node.

The third transistor may have a third base, a collector, and an emitter and the coupling circuitry may be further configured to couple the emitter to the third base. In some embodiments, the coupling circuitry is further configured to couple the third transistor to the first amplifier.

In some embodiments, the amplifier network further includes a third amplifier. The first transistor may be configured to sense an ambient temperature.

The second transistor may be configured to sense a temperature at the second amplifier. In some embodiments, the second transistor is situated approximately three microns from the second amplifier.

In some embodiments, the second transistor is configured to draw less current in response to heating at the second amplifier. The first amplifier may be configured to draw more current in response to the second transistor drawing less current. In some embodiments, an amount of gain decrease at the first amplifier is approximately equal to an amount of gain increase at the second amplifier.

According to some implementations, the present disclosure relates to a circuit comprising an amplifier network including a first amplifier and a first transistor having a first base. The first transistor is thermally isolated from the first amplifier. The circuit further comprises a second transistor having a second base. The second transistor is thermally linked to the first amplifier. The circuit further comprises coupling circuitry configured to couple the first base to the second base.

The circuit may further comprise a bias network configured to bias the first amplifier with a reference current. The bias network may include a first resistor, a second resistor, and a third transistor.

In some embodiments, the coupling circuitry is further configured to couple the first resistor, the second resistor, the first transistor, and the second transistor at a first node. The coupling circuitry may be further configured to couple the third transistor to the first amplifier.

The second transistor may be configured to draw less current in response to heating at the first amplifier. In some embodiments, the first amplifier is configured to draw more current in response to the second transistor drawing less current.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

When an amplifier is turned on, the active amplification devices within the amplifier turn on and hence some level of self-heating of the amplifier is realized such that a temperature at and/or around the amplifier may increase. In some cases, an amplifier may have multiple amplification stages which may each experience some level of self-heating. This 'self-heating' effect may result in a decrease of gain of the amplifier and/or gain variation over time which may cause degradation of the error vector magnitude (EVM) of the amplifier (which is a measure of linearity). For amplifiers that are pulsed and are used in modulated systems (e.g., with peak-to-average signals), the gain variation over time may be even further degraded, which may result in a degraded dynamic EVM (DEVM). EVM degradation for a 4 ms pulse has been shown to be directly related to gain decrease over the pulse width.

Some general mobile power amplifiers may not be suitable for use with controllers that can shape the bias versus time to compensate for self-heating of transistors. Gallium arsenide (GaAs) power amplifiers in particular may not be capable of supporting complex bias circuits to offset gain roll-off versus time. Passive circuits requiring no analog processing can help compensate for the gain roll-off versus time.

Figure 1:
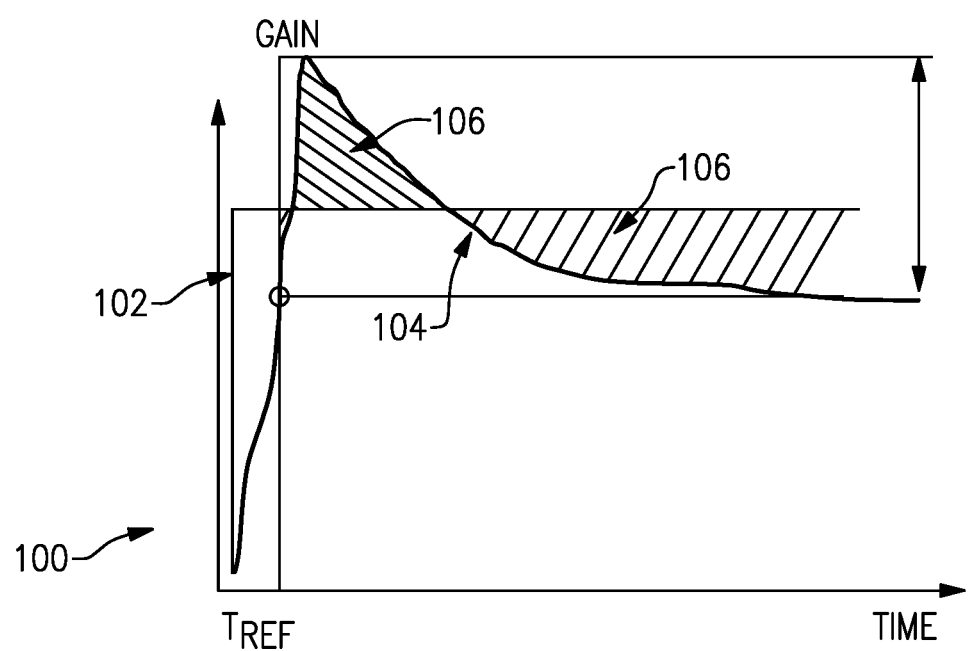
FIG. 1 illustrates a comparison graph showing an ideal gain plot and a practical gain plot.

FIG. 1 illustrates a comparison graph 100 showing an ideal gain plot and a practical gain plot. A first plot 102 provides ideal gain performance: when the amplifier is turned on, the ideal amplifier immediately reaches a peak gain value and maintains the peak gain value indefinitely. In comparison, a second plot 104 provides an example of practical gain performance: when the amplifier turns on, there is a period of delay before the amplifier ramps up to a peak gain value and gradually decreases from the peak gain value over time. Practical gain performance as illustrated by the second plot 104 creates various instances of error 106, or in other words, differences from the ideal gain performance. Error 106 is measured in FIG. 1 beyond a "tref" (e.g., beginning of preamble) point. It is advantageous to minimize the error as much as possible for an amplifier.

Some embodiments described herein provide devices and/or methods for reducing gain error. In some embodiments, a circuit for a power amplifier may be configured to self-correct and/or otherwise respond to heating at an amplifier network of the power amplifier. Moreover, a power amplifier may include various devices configured to detect heating at and/or near the amplifier network. Responses to heating may be performed automatically in response to detected heating. Some embodiments may be configured for use with multi-stage (e.g., two or more amplification stages) while some embodiments may be configured for use with single-stage amplifiers as well or alternatively.

Figure 2:
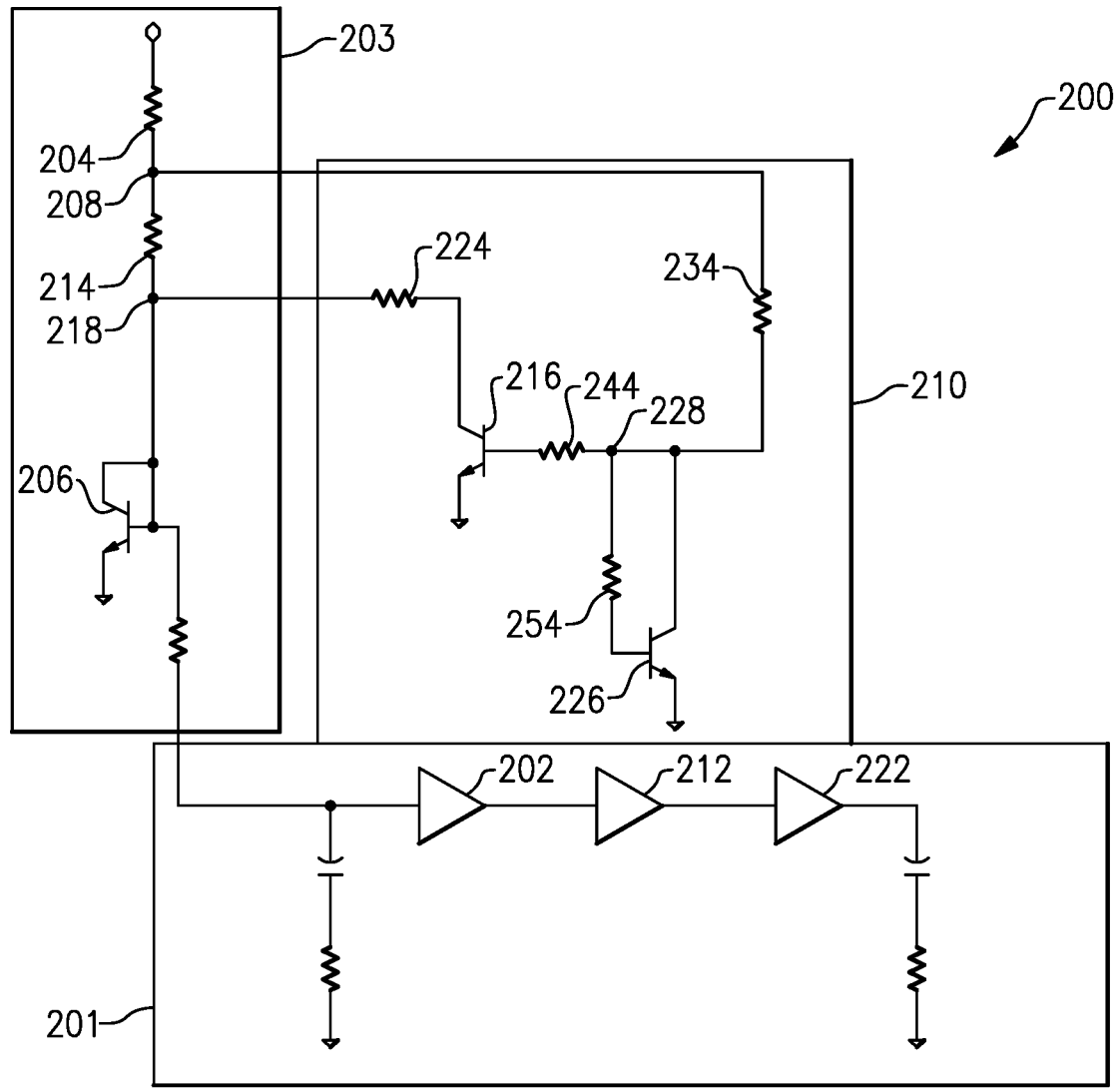
FIG. 2 provides an illustration of a gain compensation circuit in accordance with some embodiments.

FIG. 2 provides an illustration of a gain compensation circuit 200 in accordance with some embodiments. The circuit 200 may include an amplifier network 201 including a first-stage amplifier 202, a second-stage amplifier 212, and/or a third-stage amplifier 222. A first resistor 204, second resistor 214, and/or first transistor 206 may be included in a bias network 203 configured to bias the first-stage amplifier 202 with a reference current ("Iref"). The first resistor 204 may be coupled to the second resistor 214 (e.g., at a first node 208) and/or the second resistor 214 may be coupled to the first transistor 206 (e.g., at a second node 218). In some embodiments, the emitter and/or collector of the first transistor 206 may be coupled to the base of the first transistor 206 such that the first transistor 206 may be configured to act a bias diode. The circuit 200 may further include a second transistor 216 and/or a third transistor 226. Together, the second transistor 216 and third transistor 226 may form a current mirror 210 and may draw some amount of the reference current. The current value of the reference current may be determined by the size of the current mirror 210 and/or the respective resistance values of the first resistor 204, second resistor 214, a third resistor 224 coupled to the second transistor 216 (and/or coupled to the second resistor 214 and/or first transistor 206 at the second node 218), and/or a fourth resistor 234 coupled to the third transistor 226 and/or the second transistor 216 at a third node 228. The fourth resistor 234 may also or alternatively be coupled to the first resistor 204 and/or the second resistor 214 at the first node 208.

In some embodiments, the third transistor 226 may be positioned in the circuit 200 as closely as possible to one of the amplifiers (e.g., the second-stage amplifier 212) such that the third transistor 226 may be thermally linked to at least one of the amplifiers. The term "thermally linked" is used herein according to its broad and ordinary meaning and may refer to a physical and/or non-physical connection between multiple devices wherein heating at one of the devices causes heating at another of the devices. Similarly, the term "thermally isolated" is used herein according to its broad and ordinary meaning and may refer to an absence of a physical and/or non-physical connection between multiple devices wherein heating at one of the devices does not cause heating at another of the devices. While the third transistor 226 is shown in FIG. 2 as being in close proximity to and/or thermally linked to the second-stage amplifier 212, the third transistor 226 may be additionally or alternatively positioned in close proximity to and/or thermally linked to the first-stage amplifier 202 and/or the third-stage amplifier 222.

In some embodiments, heating (e.g., self-heating as a result of turning on) of the amplifier network 201 (e.g., at the second-stage amplifier 212) may cause heating of the third amplifier 226. When a temperature of the third amplifier 226 increases, it may create a temperature difference (e.g., delta) between the third amplifier 226 and the second amplifier 216. The second transistor 216 may be positioned such that the second transistor 216 may be thermally isolated from the second-stage amplifier 212. For example, the second transistor 216 may be positioned a suitable distance from the second-stage amplifier 212 such that any heating of the second-stage amplifier 212 may have a null and/or minimal impact on the second transistor 216. In this way, the second transistor 216 may sense an ambient temperature at and/or around the circuit 200 and/or may not be impacted by heating at the amplifier network 201. Accordingly, temperature increases at the amplifier network 201 may directly affect temperature of the third transistor 226 but not the second transistor 216.

The proximity between the third transistor 226 and the second-stage amplifier 212 (and/or first-stage amplifier 202 and/or third-stage amplifier 222) may be process-dependent. For example, there may be a process limitation for how close one transistor can be to another. The third transistor 226 and second-stage amplifier 212 (and/or first-stage amplifier 202 and/or third-stage amplifier 222) may be as close as possible based on the process limitations. For example, the proximity of devices may be limited to no closer than approximately three microns. Accordingly, the third transistor 226 may be situated approximately three microns from the second-stage amplifier 212. In some embodiments, an array of amplifiers may be included in the circuit 200 and/or the third transistor 226 may be situated between multiple amplifiers (e.g., between the second-stage amplifier 212 and the third-stage amplifier 222) to increase the amount of heat sensed at the third transistor 226.

When the second-stage amplifier 212 (or other amplifier of the amplifier network 201) experiences some level of self-heating, the third transistor 226 may likewise heat up due at least in part to the proximity of the third transistor 226 to the second-stage amplifier 212. As a result of heating at the second-stage amplifier 212 and/or the third transistor 226, the current mirror 210 may draw less reference current. Due at least in part to the current mirror 210 drawing less current, a higher level of current may be drawn by the first transistor 206, which may accordingly boost a current value and/or gain value of the first-stage amplifier 202. In some embodiments, an amount of gain increase at the first-stage amplifier 202 may be approximately equal to an amount of gain decrease at the second stage amplifier 212 and/or at the third-stage amplifier 222.

The third resistor 224 may be coupled to the emitter or collector of the second transistor 216 and may be configured to reduce the base voltage (Vbe) across the second transistor 216. For example, as a result of temperature increase at the third transistor 226, the third resistor 224 may facilitate a reduction of Vbe across the second transistor 216 and/or the third transistor 226.

The fourth resistor 234 may be coupled to the emitter or collector of the third transistor 226 and/or may be coupled to the base of the second transistor 216. In some embodiments, the fourth resistor 234 may be configured to set an amount of current consumed and/or drawn by the current mirror 210. In some cases, the lower the amount of power dissipated by the circuit 200, the better the circuit 200 may be able to sense temperature changes in the amplifier network 201.

When the second-stage amplifier 212 (or other amplifier(s)) heats up, feedback may be generated in the circuit 200 to cause the current to rise in the first-stage amplifier 202 (and/or other amplifier(s)). With the rise in current, the gain of the circuit 200 may increase as well. The gain at the second-stage amplifier 212 may decrease with increase in heat. Therefore, by increasing the current and/or gain at the first-stage amplifier 202, the net gain delta over time of the amplifier network may be approximately zero.

The second transistor 216 may be thermally isolated from the amplifier network (e.g., situated a sufficient distance from the amplifier network that heating from the amplifiers causes minimal impact at the second transistor 216) such that the second transistor 216 is configured to sense the ambient temperature of the semiconductor die. In some embodiments, the second transistor 216 and third transistor 226 may share a common node. For example, the base of the second transistor 216 may be coupled to a fifth resistor 244 and the base of the third transistor 226 may be coupled to a sixth resistor 254. The fifth resistor 244 and/or sixth resistor 254 may be coupled at the third node 228. Accordingly, the second transistor 216 and the third transistor 226 may have an equal current. If the temperature at the second transistor 216 and the third transistor 226 is the same, an equal voltage may be applied to the second transistor 216 and the third transistor 226 at the third node 228. As the third transistor 226 heats up, the base voltage of the third transistor 226 may decrease. Accordingly, the voltage and current at the second transistor 216 may decrease as well. As a result, less current may be drawn at the second resistor 214. The voltage on the collector of the first transistor 206 may increase which may in turn increase the voltage at the base of the second transistor 216. The increase of voltage at the first transistor 206 may cause an increase of bias voltage and/or current at the first-stage amplifier 202.

While the amplifier network 201 in FIG. 2 includes three stages/amplifiers, the amplifier network 201 may alternatively include a single stage, two stages, or more than three stages. The level of compensation required to achieve a net zero (or as close as possible to net zero) gain may be different for different numbers of stages of the amplifier network 201. For example, for an amplifier network 201 including a single stage, the required compensation for the circuit 200 may be compensating for only the single stage. Accordingly, less feedback may be generated for a single-stage amplifier network 201. The amount of bias may not be increased for single-stage and/or two-stage amplifier networks 201. Moreover, for a single-stage amplifier network 201, the third transistor 226 (or other device) may sense the temperature of the single amplifier.

The third transistor 226 may be configured and/or situated to sense temperature at any stage of the amplifier network 201. In some cases, each successive stage of an amplifier network 201 may have a temperature increase because each successive stage may have an increasing periphery and may accordingly generate more heat. Moreover, by sensing temperature at a successive stage (e.g., the second-stage amplifier 212 and/or the third-stage amplifier 222), gain compensation may be performed by changing gain values at the first-stage amplifier 202. Changing gain at the first-stage amplifier 202 may be relatively simpler than changing gain at successive stages due to the linearity of the amplifier network 201. The current and/or gain of the first-stage amplifier 202 may advantageously be changed without greatly affecting linearity. Successive stages may be biased down to a greater extent as far as current density in comparison to the first-stage amplifier 202 because the successive stages may be larger. In some cases, the second-stage amplifier 212 may have a more consistent temperature rise independent of output power than other stages. Accordingly, the second-stage amplifier 212 may provide a desirable balance between temperature increase and thermal dissipation without being situated within the control loop.

Figure 3:
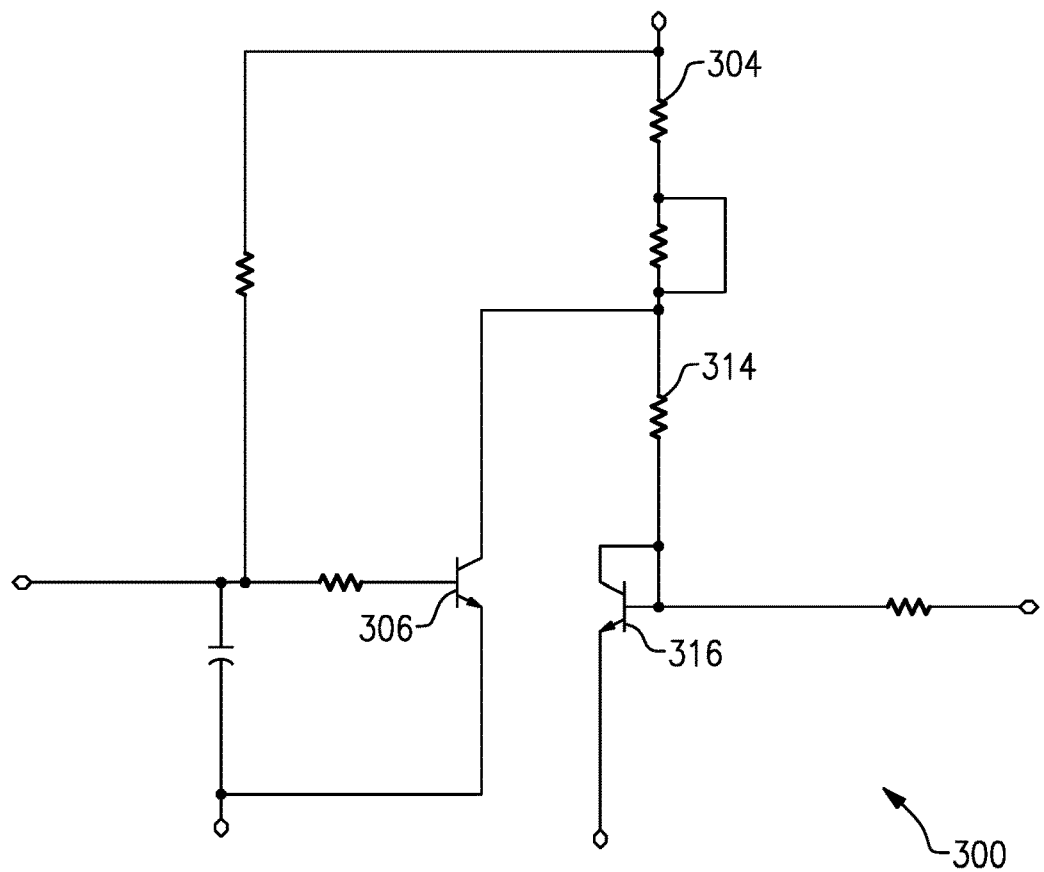
FIG. 3 provides another circuit for gain correction in accordance with some embodiments.

FIG. 3 provides another circuit 300 for gain correction in accordance with some embodiments. In some embodiments, a first resistor 304 and/or a second resistor 314 may be configured to set a current difference for the circuit 300. The circuit 300 may include a control transistor 306 configured to sense an ambient temperature of the circuit 300. In some embodiments, the control transistor 306 may be configured to provide approximately 4× temperature sensing. The circuit 300 may additionally or alternatively comprise a second transistor 316, which may be coupled in parallel to the control transistor 306 and/or in series with the second resistor 314.

Figure 4:
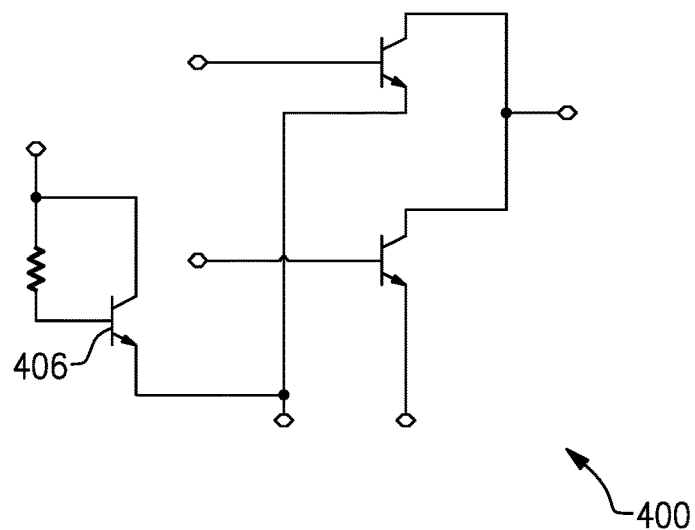
FIG. 4 provides another circuit for gain correction in accordance with some embodiments.

FIG. 4 provides another circuit 400 for gain correction in accordance with some embodiments. In some embodiments, the circuit 300 and the circuit 400 may be combined/coupled into a single schematic. The circuit 400 may include a sensing transistor 406 configured to sense changes in temperature from other devices of the circuit 400 and/or other circuits near the circuit 400.

Figure 5:
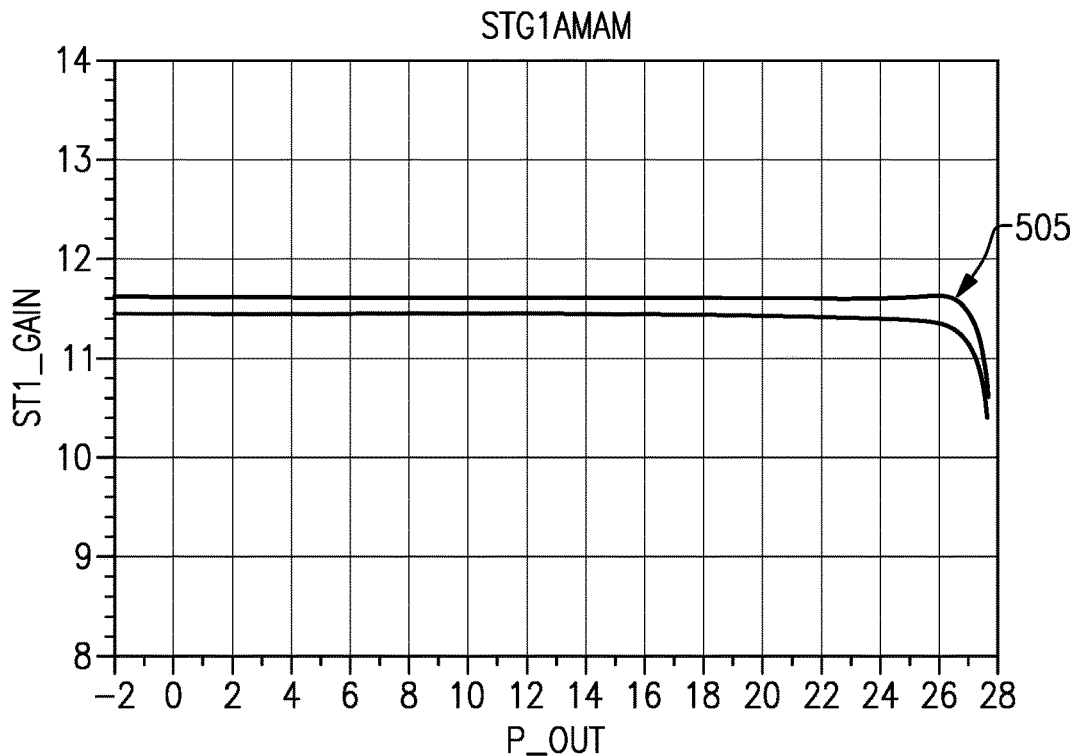
FIG. 5 provides a comparison graph between conventional devices and devices in accordance with one or more embodiments herein.

FIG. 5 provides a comparison graph between conventional devices and devices in accordance with one or more embodiments herein. Embodiments described herein (represented by a first plot 505) may advantageously provide an increase in gain (e.g., an approximately 0.15 dB increase for an increase of approximately 12 degrees) over conventional devices.

In some cases, gain compensation may have an effect of "softening" the turn-on characteristics of a power amplifier. Gain compensation may add a thermal time constant to a bias circuit. There may be a trade-off between 90 µs (and 300 µs) and 4 ms EVM performance. It may be desirable to determine a set point that provides a performance compromise.

Figure 6:
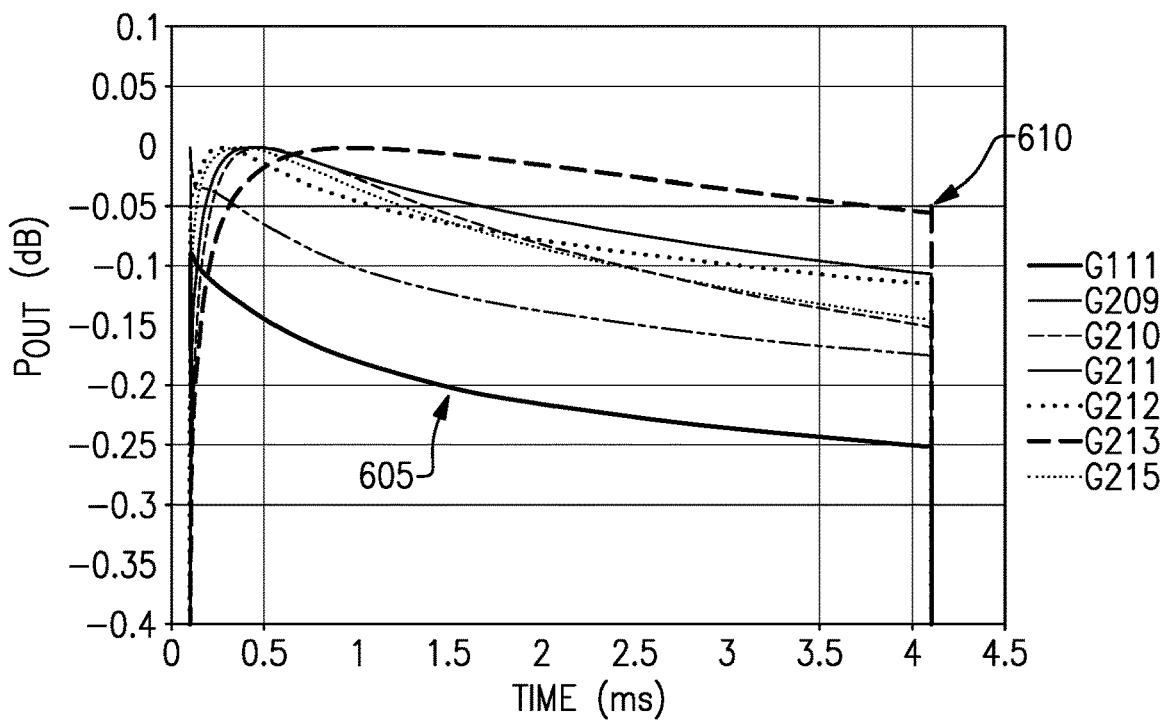
FIG. 6 provides several gain versus time plots over a 4 ms burst in accordance with some embodiments described herein.

FIG. 6 provides several gain versus time plots over a 4 ms burst in accordance with some embodiments described herein. Each plot may represent a different compensation amount setting. A first plot 605 represents a conventional (e.g., uncompensated) circuit while other plots, including a second plot 610, may represent a circuit with temperature compensation features as described herein, which may provide improvements in gain over the 4 ms burst.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A circuit comprising:
   an amplifier network including a first amplifier;
   a first transistor having a first base, a first emitter, and a first collector, the first transistor being thermally isolated from the first amplifier;
   a second transistor having a second base, a second emitter, and a second collector, the second transistor being thermally linked to the first amplifier;
   a bias network configured to bias the amplifier network with a reference current; and
   coupling circuitry configured to couple the first base to the second base, the first collector to the bias network, and the second collector to the bias network.

2. The circuit of claim 1 wherein the amplifier network further comprises a second amplifier in series with the first amplifier.

3. The circuit of claim 2 wherein an amount of gain decrease at the first amplifier is approximately equal to an amount of gain increase at the second amplifier.

4. The circuit of claim 1 wherein the bias network comprises a third transistor having a third base, a third emitter, and a third collector.

5. The circuit of claim 4 wherein the coupling circuitry is further configured to couple the third collector to the first collector and to the second collector.

6. The circuit of claim 4 wherein the coupling circuitry is further configured to couple the third base to the first base and to the second base.

7. The circuit of claim 4 wherein the coupling circuitry is further configured to couple the third emitter to the third base.

8. The circuit of claim 4 wherein the coupling circuitry is further configured to couple the third base to the first amplifier.

9. The circuit of claim 1 further comprising a first resistor coupled to the first base and a second resistor coupled to the second base.

10. The circuit of claim 9 wherein the coupling circuitry is further configured to couple the first resistor to the second resistor.

11. The circuit of claim 1 wherein the first transistor is configured to sense an ambient temperature.

12. The circuit of claim 1 wherein the second transistor is configured to sense a temperature at the first amplifier.

13. The circuit of claim 1 wherein the second transistor is configured to draw less current in response to heating at the first amplifier.

14. The circuit of claim 13 wherein the first amplifier is configured to draw more current in response to the second transistor drawing less current.

15. A circuit comprising:
   an amplifier network including a first amplifier;
   a first transistor having a first base, a first emitter, and a first collector, the first transistor being thermally isolated from the first amplifier;
   a second transistor having a second base, a second emitter, and a second collector, the second transistor being thermally linked to the first amplifier;
   a bias network configured to bias the amplifier network with a reference current, the bias network comprising a third transistor having a third base, a third emitter, and a third collector; and coupling circuitry configured to couple the third collector to the first collector and to the second collector.

16. The circuit of claim 15 wherein the amplifier network further comprises a second amplifier in series with the first amplifier.

17. The circuit of claim 16 wherein an amount of gain decrease at the first amplifier is approximately equal to an amount of gain increase at the second amplifier.

18. The circuit of claim 15 wherein the coupling circuitry is further configured to couple the third base to the first base and to the second base.

19. The circuit of claim 15 wherein the coupling circuitry is further configured to couple the third emitter to the third base.

20. The circuit of claim 15 wherein the coupling circuitry is further configured to couple the third base to the first amplifier.

\* \* \* \* \*